United States Patent [19]

Costello

[11] Patent Number: 5,040,236
[45] Date of Patent: Aug. 13, 1991

[54] APPARATUS FOR IRRADIATION OF PRINTED WIRING BOARDS AND THE LIKE

[75] Inventor: Bernard J. Costello, Princeton, N.J.
[73] Assignee: Argus International, Ringoes, N.J.
[21] Appl. No.: 554,272
[22] Filed: Jul. 18, 1990
[51] Int. Cl.$^5$ ............................................. F27B 9/24
[52] U.S. Cl. ................................. 392/417; 392/418; 392/419; 219/388; 414/157; 198/803.14; 198/848
[58] Field of Search ................ 392/417–419, 392/407, 420; 219/388, 503, 495; 198/848, 803.14, 803.15; 414/157, 159

[56] References Cited

U.S. PATENT DOCUMENTS

| | | | |
|---|---|---|---|
| 3,552,645 | 1/1971 | Boyd | 250/210 |
| 3,655,173 | 4/1972 | Costello | 219/388 |
| 3,744,557 | 7/1973 | Costello | 219/388 |
| 3,960,081 | 6/1976 | Gustaus et al. | 34/41 |

Primary Examiner—Bruce A. Reynolds
Assistant Examiner—John A. Jeffery
Attorney, Agent, or Firm—Louis Weinstein

[57] ABSTRACT

An open-weave conveyor moves a printed wiring board through a region of radiant energy. The conveyor has a plurality of supporting projections extending from the major surface of the conveyor to minimize engagement between the conveyor and the board, providing at least three projections supporting each board above the open-weave conveyor to eliminate a shadow effect caused by radiation blocked by conveyor strands. Guides move the conveyor along an arcuate path away from the printed wiring board in the radiation region, assuring irradiation of the entire printed wiring board surface. This technique is advantageous for simultaneously irradiating both sides of a board during a dry film solder masking technique. The solder mask is radiated to promote cross-linking of the film polymer. To reduce thermal shock and abrupt temperature rise in the workpiece, the ultraviolet source includes a water envelope to absorb infrared radiation. A series of irradiation devices, one with and one without the aforementioned water envelope, may be utilized. A liquid component utilized in the dry film solder masking tecnique to fill voids and irregularities in the printed wiring board surface irradiated in this manner remains stable, preventing the overlaying film from cracking during a semi-curing step followed by further UV processing which provides a full cure. A lamp regulator permits smooth regultion of radiant energy while eliminating the need to regulate or change capacitors. A sensor monitors the UV lamp output to adjust and maintain the desired radiation operating levels.

27 Claims, 6 Drawing Sheets

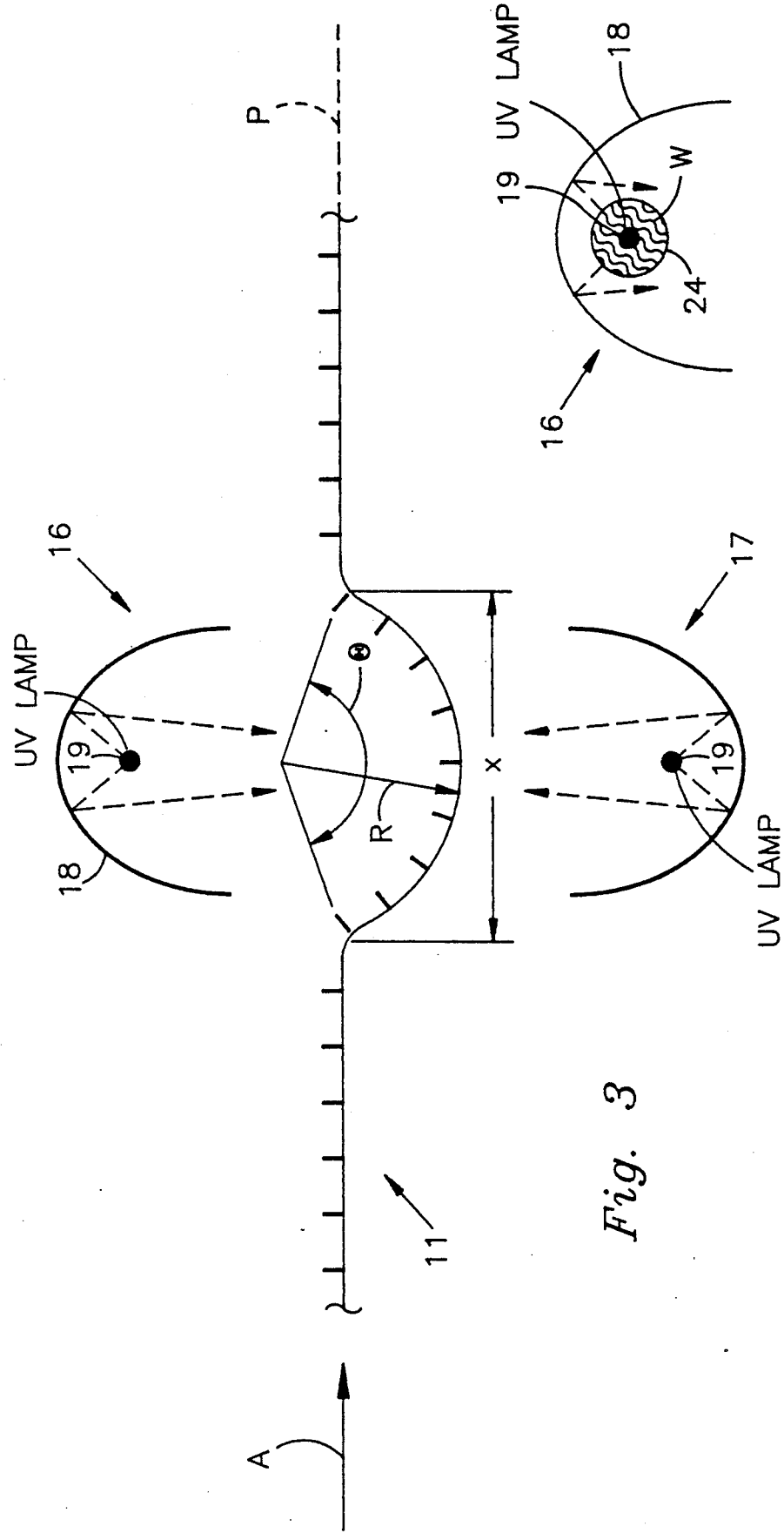

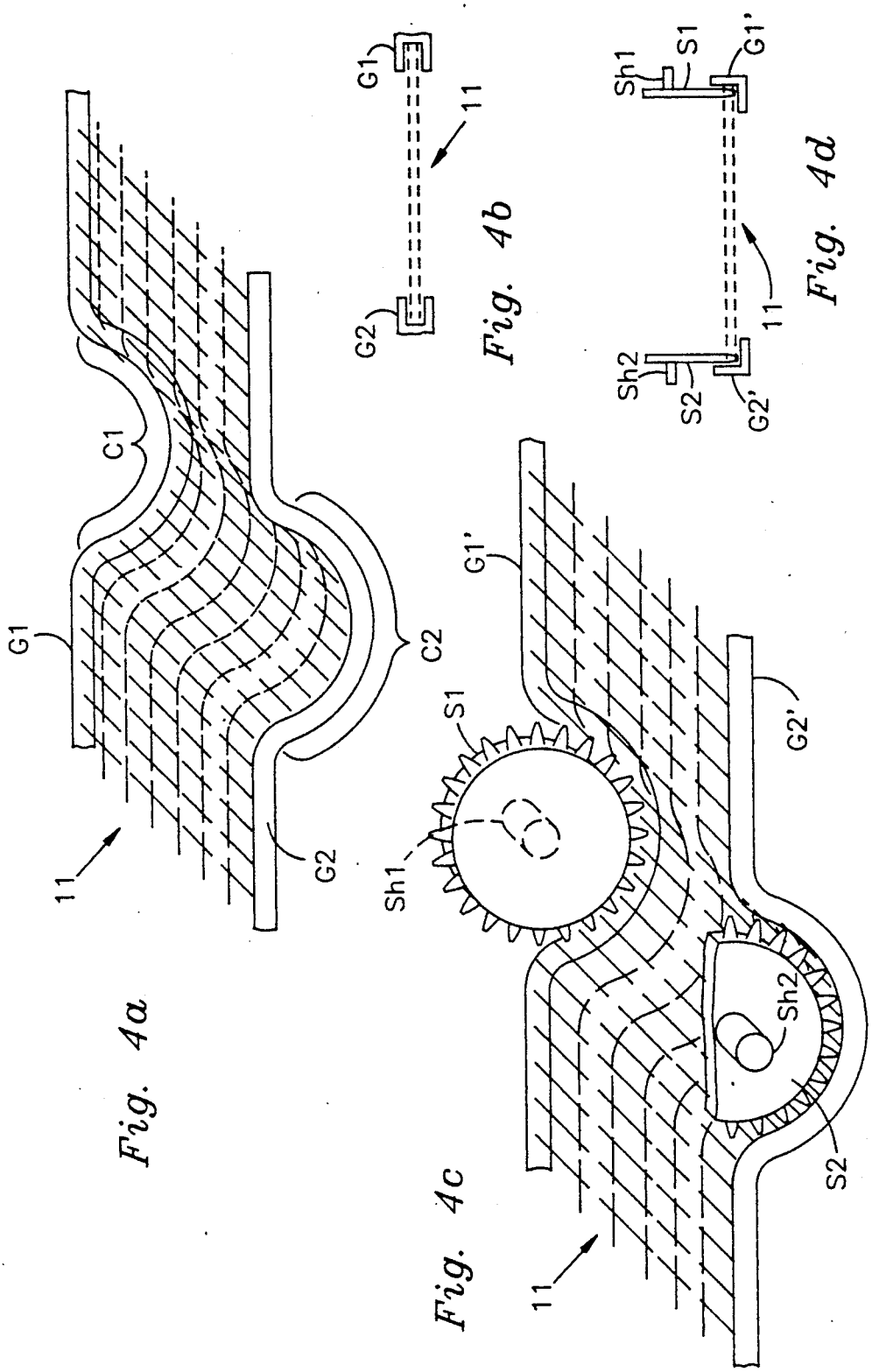

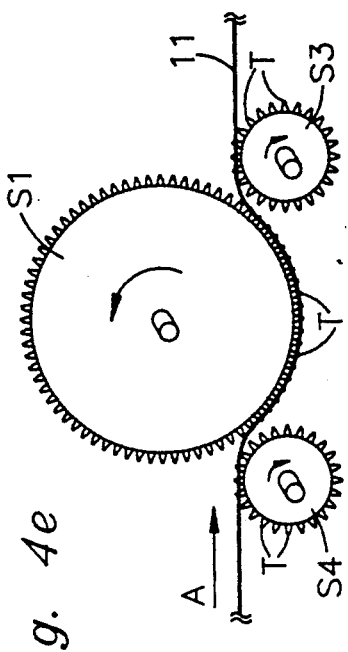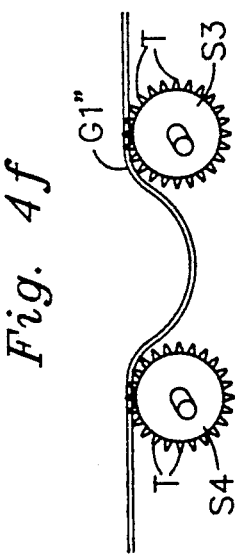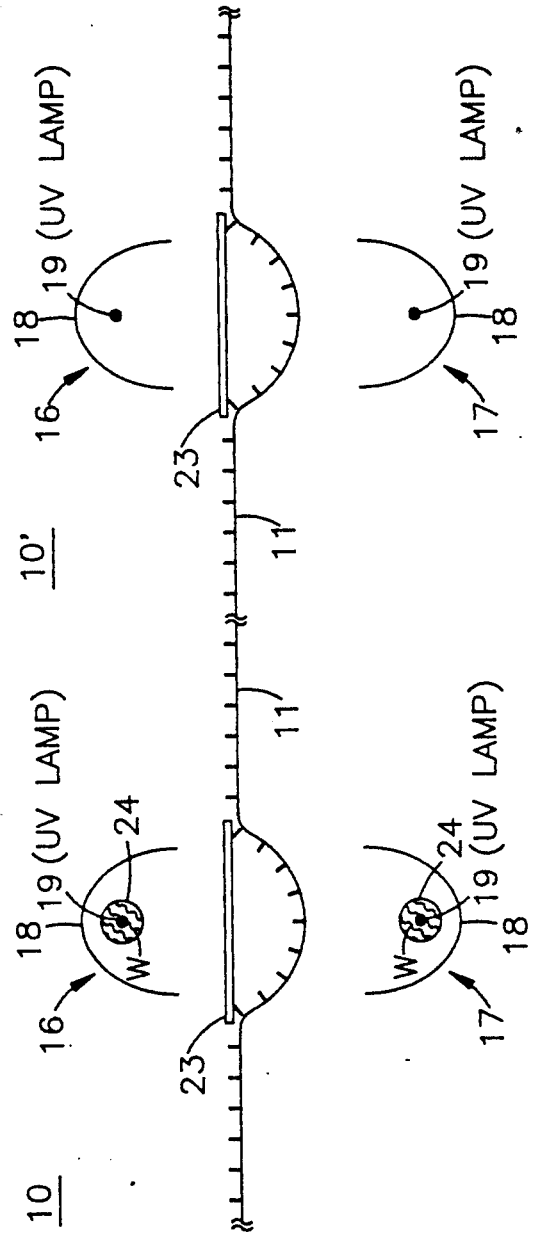

APPARATUS FOR IRRADIATION OF PRINTED WIRING BOARDS AND THE LIKE

FIELD OF THE INVENTION

The present invention relates to method and apparatus for exposing and irradiating opposite surfaces of a workpiece and more particularly to a novel method and apparatus for uniformly irradiating the entire surface areas of opposite surfaces of the workpiece through the employment of novel conveyor guiding apparatus and further including method and apparatus for achieving superior results when utilizing the aforesaid apparatus and method in the performance of a dry film solder masking technique through the employment of a semi-curing stage followed by a full curing stage and wherein the radiant energy devices are made easily adjustable and automatically maintain the desired radiant energy output levels through novel control and monitoring circuitry.

BACKGROUND OF THE INVENTION

Apparatus presently exists for simultaneously exposing and irradiating the opposite surfaces of a workpiece. For example, see U.S. Pat. No. 3,655,173 issued Apr. 11, 1972.

One specific application of the method and apparatus of the present invention relates to the production of printed wiring boards (hereinafter "PWBs" or, simply, "boards") and more particularly to radiation treatment of solder mask films applied to the surface (or surfaces) of PWBs.

"Solder mask" is a term utilized to identify a coating applied to the surface of a PWB which has the unique property of preventing solder from making contact with predefined surface areas on the PWB during soldering or solder coating processes, which predefined surfaces are coated with a "solder mask".

Solder mask may be applied to PWBs by a variety of methods including, but not limited to, screen printing, wet photo-imaging, and dry film photo-imaging. The apparatus and method of the present invention may be used to great advantage in practicing the dry film solder masking technique (hereinafter referred to as "DFSM"). However, the present invention may also find advantageous application in other similar processes.

Performance of the DFSM technique includes a series of process steps for applying the solder mask film and establishing the ultimate desired image or pattern upon one or both surfaces of a PWB. The specific steps of the DFSM technique are well known to those having ordinary skill in the solder masking field and will not be repeated herein for purposes of brevity. For the purpose of understanding the present invention and the advantages derived from the utilization of the present invention in the performance of the DFSM technique it is sufficient to understand that the final step in the process is irradiation of the film with ultraviolet (UV) radiant energy which promotes cross-linking of the polymers utilized in the masking film and for establishing the desired physical characteristics of the film.

In performing the irradiation process it is often required that opposing surfaces of the workpiece be irradiated, especially when both surfaces are coated with the solder mask material. It is further desirable to perform the irradiation process with minimum temperature rise in the workpiece to mitigate temperature induced shock and/or thermal expansion of components comprising the PWB. It is further desirable to simultaneously irradiate both surfaces of the PWB to achieve maximum efficiency of space and/or machinery utilization and to minimize manipulation and/or handling of the workpiece.

Irradiation of surfaces is a well known art which takes a variety of forms and functions. In the employment of the DFSM technique, it is desirable to have the workpiece travel continuously from workpiece loading to UV processing to removal and collection while oriented horizontally upon a conveying mechanism.

A conveying mechanism suitable for use in practicing the present invention is described in U.S. Pat. No. 3,655,173 issued Apr. 11, 1972 in the name of the present inventor and assigned to the assignee of the present invention. The conveyor described therein is of an open mesh type enabling radiation to substantially pass therethrough and impinge upon a workpiece substantially without obstruction due to the strands of the open mesh structure. Selected strands of the conveyor of the aforementioned U.S. Patent are provided with supporting projections (hereinafter referred to as "contacts") which maintain the workpiece a displaced distance above the general plane of the open mesh conveyor and which cooperate with the irradiation devices to minimize the shadowing effect of the mesh upon the surface of the workpiece.

Although the total surface contact between the workpiece and the mesh conveyor is limited to the aforesaid contacts, the workpiece nevertheless rests upon and engages a plurality of contacts which remain in contact with the PWB during the duration of conveyance, subjecting the support points and the immediately surrounding areas to experience some difference in radiation compared with those areas of the PWB displaced from the conveyor belt contacts resulting in non-uniform radiation and heating which can cause significant differences in physical properties between the points of support and the remaining surface area.

BRIEF DESCRIPTION OF THE INVENTION

The present invention is characterized by comprising a double-sided radiation system employing a conveyor mechanism utilizing guides for moving the conveyor through an arcuate path (hereinafter referred to as a "jog") which displaces the contacts from the otherwise engaging surface of the PWB. The jog may be preferably placed in or close to the zone of irradiation which further minimizes the shadow effect of the support point on the workpiece and significantly reduces the effect of the conveyor mesh on the irradiation so that it becomes a substantially inconsequential variable. The utilization of simultaneous irradiation of both sides of the PWB improves energy efficiency and creates more consistent and repeatable process zones through which the PWB passes.

Simultaneous irradiation has also been found to cause an undesirable side effect which is manifested as thermal shock and a significant increase in temperature in the workpiece. This effect is minimized by placing a water envelope around the ultraviolet source which technique is disclosed in U.S. Pat. No. 3,960,081 issued June 1, 1976. The water in the surrounding envelope absorbs a significant amount of infrared energy which is not necessary for the UV polymerization process and merely contributes to the undesirable thermal effects referred to hereinabove.

The energy required for UV radiation may vary from workpiece to workpiece and hence it is extremely advantageous to provide a means for adjusting output energy level in a smooth and continuous fashion. Prior art techniques require the selective switching of capacitors employed in the power supply. The present invention utilizes an adjustable power circuit which generates a regulated DC current applied to a magnetic amplifier connected in electrical parallel with a bank of capacitors for automatically adjusting the conductance of the parallel network through the use of a small DC current. The adjusted current is regulated by a sensor which senses current in the secondary of the lamp ballast, which signal is fed back to the lamp regulator circuit for maintaining a preselected energy output level.

The energy supplied to the lamps may also be regulated as a function of the UV energy outputted by the system as opposed to the secondary current of the ballast. This is accomplished through the utilization of a UV sensor employing an appropriate band-pass filter for sensing the output of both lamps to control the lamp output power as a function of the UV output rather than as a function of lamp current as is employed in prior art systems.

The system of the present invention is extremely advantageous for use in a dry film solder masking technique which employs a liquid component initially applied to the PWB surface before the dry film is applied, said liquid component being arranged under the dry film to fill voids and irregularities upon the PWB surface. This liquid component is a 100% reactive material which eventually polymerizes and becomes solid and unites with the overlying film during the UV process.

The use of apparatus known to the prior art in the performance of the dry film solder masking process described hereinabove causes the liquid component mentioned hereinabove to become unstable which resulted in the bulging and cracking of the overlaying film due to thermal shock and excursion.

The apparatus of the present invention is extremely advantageous for use in a process typically known as the "cold UV bump" process in which the aforementioned liquid component which collects in holes or upon irregularities of the PWB surface is semi-cured into a semi-solid during an initial UV radiation treatment utilizing water jacket cooling, which initial semi-curing is followed by a final curing operation utilizing the apparatus of the present invention with the water jacket cooling apparatus removed in order to complete the UV/heat cure of the film and the underlying, semi-cured liquid.

OBJECTS OF THE INVENTION

It is, therefore, one object of the present invention to provide a novel method and apparatus for irradiation of a workpiece wherein an open mesh conveyor is jogged away from the workpiece, preferably in the irradiation region to assure uniform irradiation and heating of both sides of the workpiece.

Another object of the present invention is to provide a novel method and apparatus for radiation treatment of a workpiece in which both sides of the workpiece are simultaneously exposed to radiation and wherein the open mesh conveyor supporting the workpiece is jogged away from the workpiece preferably in the radiation region to assure uniform irradiation of the workpiece.

Still another object of the present invention is to provide novel method and apparatus for UV radiation of a workpiece in which heating of a workpiece due to infrared radiation is significantly reduced thereby reducing exposure of the workpiece to thermal shock.

Still another object of the present invention is to provide a novel method for preventing the bulging and breaking of a solder mask film in a PWB due to the instability of a liquid component arranged between the mask film and the PWB surface by exposing the PWB to a semi-curing technique followed by a final curing technique which serves to stabilize the aforesaid liquid component.

Still another object of the present invention is to provide novel adjustment circuitry for smoothly adjusting the energy output of a radiant energy source utilized for treating workpieces and the like.

Still another object of the present invention is to provide a novel circuit for adjusting the energy output of a radiant energy source employed for treating workpieces with radiation and which enables a small adjustable DC current to be utilized for adjusting the energy output of the radiant energy device.

Still another object of the present invention is to provide novel control means for monitoring the usable radiant energy to maintain the energy output level of a radiant energy device constant.

Still another object of the present invention is to provide a novel method and apparatus for dry film solder masking of printed wiring boards and the like in which a liquid component which is utilized to fill holes and irregularities in a printed wiring board surface is initially semi-cured and subsequently undergoes a final curing step wherein radiation other than the desired UV radiation is significantly reduced during the semi-curing phase to prevent the liquid component from causing the overlaying solder mask film to bulge and/or crack.

BRIEF DESCRIPTION OF THE DRAWINGS

The above, as well as other objects of the present invention, will become apparent when reading the accompanying description and drawings, in which:

FIG. 3 is a simplified elevational view illustrating one of the principal features of the present invention;

FIG. 3a is an elevational view of a modified version of the apparatus shown in FIG. 3;

FIG. 4a shows one embodiment for obtaining a jog of the conveyor belt to achieve the objectives of the invention illustrated in FIG. 3;

FIG. 4b shows another alternative arrangement for jogging the conveyor belt; and FIGS. 4c and 4d show perspective and end views respectively of another embodiment for providing a jog in the conveyor belt;

FIGS. 4e and 4f show elevational views of still further embodiments for jogging the conveyor belt;

FIG. 5 is a simplified diagram showing apparatus for curing a solder mask applied in accordance with a DFSM technique;

DETAILED DESCRIPTION OF THE INVENTION

Figure 1:
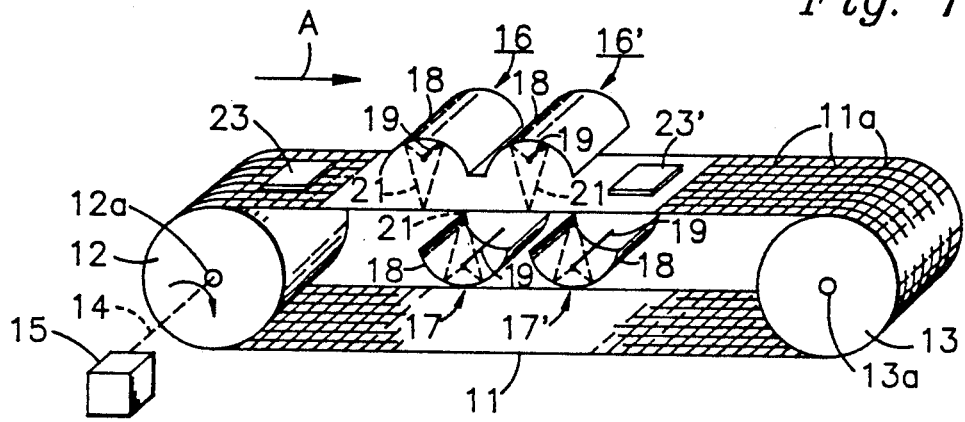
FIG. 1 is a perspective view of a conveyor and radiation treatment system embodying the principles of the present invention.

FIG. 1 shows an apparatus 10 embodying the principles of the present invention and is comprised of a closed-loop conveyor belt 11 of open mesh metallic construction and which is entrained about a pair of elongated rollers 12, 13 rotatable about shafts lying on their longitudinal axes 12a, 13a. Drive motor 15 is mechanically coupled to the shaft 12a of drive roller 12, said mechanical coupling being shown represented by dotted line 14, to move the upper run of conveyor belt 11 in the direction shown by arrow A. Roller 13 is freewheelingly mounted and is rotated by conveyor 11. Rollers 12 and 13 may be adjustably spaced from one another to maintain conveyor belt 11 under proper tension or additional idler-type tension rollers (not shown) may be employed for this purpose and particularly for the purpose of maintaining the upper run of the conveyor belt 11 substantially flat and preferably in a horizontal orientation. Rollers 12 and 13 may be replaced by rotatably mounted sprockets which mesh with or otherwise engage the conveyor along its opposite marginal edges.

Radiation generating devices 16, 16' are positioned above conveyor 11 while radiation generating devices 17 and 17' are positioned below the upper run of conveyor 11, in the manner shown. Each radiation device is comprised of a reflector member 18 having a configuration which directs the radiant energy to pass through the jogged portion of the conveyor belt. The reflector is provided with a concave surface which is highly reflective to the radiation emitted from a "line" source of radiation, which is preferably ultraviolet (UV) radiation, whereby the rays 21 emitted from each line source and impinging upon the concave reflective surface of each reflector 18 are generally focussed to create an image focal line which is a line image substantially equal to the length and dimensions of the "line" radiation source 19. The image is focussed or positioned so as to preferably lie either to one side or the other of the confronting surface of the printed wiring boards (PWBs) 23 and 23', for example, which are supported by the upper run of conveyor 11. Offsetting the image of the line source relative to the surface of the printed wiring board provides a broader area of radiation across the PWB. Focussing in this manner provides more uniform irradiation of the surface.

A PWB such as presented by numeral 23 may be positioned upon the left-hand end of the upper run of conveyor 11 and is carried by the conveyor through the focussed radiant energy emitted by each of the radiant energy devices 16 through 17'. The "line" of focussed radiation developed by each such device extends in a direction transverse to the direction of movement A of the conveyor and hence the PWBs.

Thus, PWB 23 sequentially passes through each of the focussed "lines" of radiation, ultimately passing beyond the last of the groups of radiant energy devices, reaching the position 23'. If desired, a greater or smaller number of radiant energy devices may be employed in each of the arrays shown. When more than one radiant energy device is employed in each array, they may be adjusted as to their power output levels and spacing intervals to obtain different, desired heating profiles.

The radiant energy devices are normally continuously energized and conveyor 11 is preferably continuously moved preferably at a constant speed.

When PWBs reach the location 23', they may be removed for further processing and may be cooled before or after removal.

Selected cross-wise strands 11a of the open mesh conveyor are preferably provided with upwardly bent portions or projections arranged at spaced intervals along each "strand" which serve as "contacts" for supporting each of the printed wiring boards a spaced distance D above the imaginary plane of the conveyor whereby the "shadow effect" created by the conveyor "strands" 11a is substantially reduced.

Figure 2:
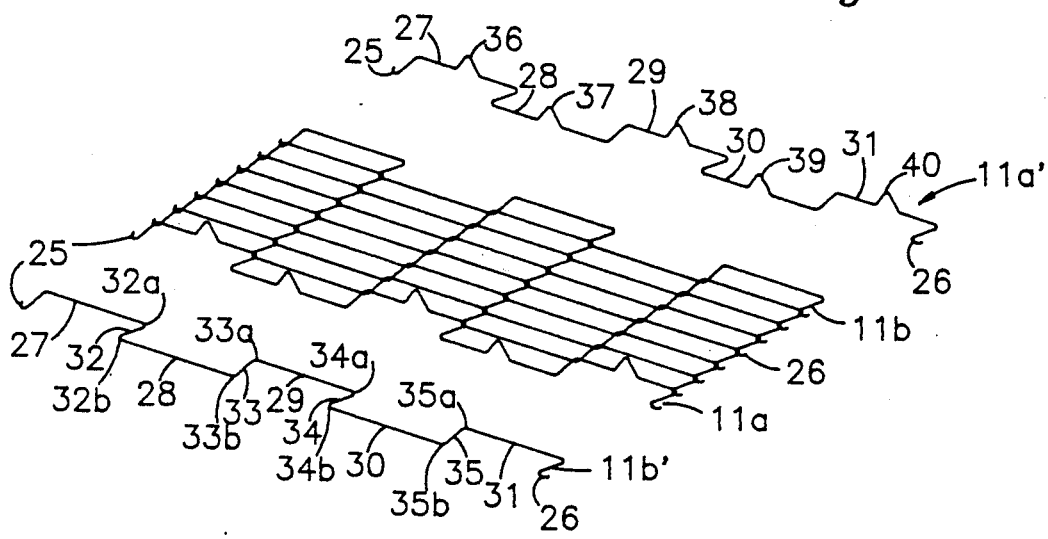
FIG. 2 is a detailed view showing a portion of the conveyor belt employed in the embodiment of FIG. 1.

FIG. 2 shows a perspective view of a portion of the open mesh conveyor 11 which is comprised of individual strands of substantially rigid metallic wires 11b which are bent to form an undulating or serpentine configuration. Noting wire 11b', for example, the ends thereof are bent to form hook-shaped configurations 25 and 26. The intermediate portion of strand 11b' has straight portions 27-31 wherein straight portions 28 and 30 are offset from straight portions 27, 29 and 31 by short straight portions 32-35 which are transverse to portions 27-31, each being joined to one of the long straight portions at a bend. Note, for example, bends 32a, 32b, 33a, 33b, and so forth.

The hook-shaped configurations 25, 26 of the strands 11b and 11b' are snap-fitted with like portions of adjacent strands to form a chain of interlocked strands as shown in FIG. 2. The strands 11b are all substantially the same as the strand 11b' described hereinabove. Strands 11a are all substantially the same as the strand 11a' which is similar to the strands 11b but with the addition of providing bent sections 36-40 at locations substantially intermediate each of the linear portions 27 through 31, respectively. The inverted, substantially V-shaped bent portions 36-40 extend upwardly from the main plane of the conveyor as shown best in FIG. 2a.

When strands of the type 11a and 11b are fully assembled, there typically being fewer strands of the type 11a, the strands are interlocked at their ends in the manner shown in FIG. 2 with the projections being spaced in the cross-wise direction at a distance typically of the order of 2 to 2.5 inches. Similar spacing may be provided between the projections of strands of the type 11a, i.e. measured in the direction of movement of the conveyor.

Figure 2A:
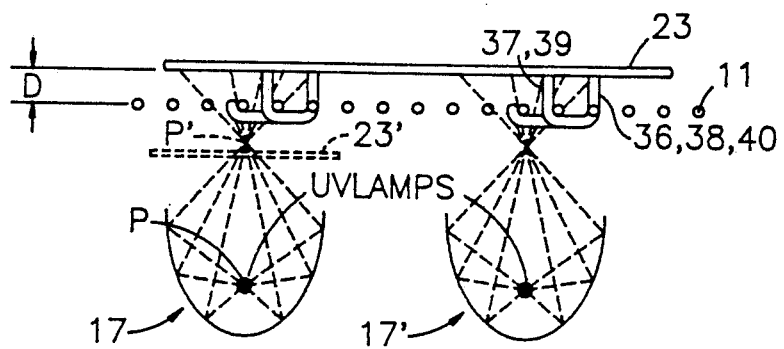
FIG. 2a is an elevational view of the conveyor belt of FIG. 2.

The projections, or "contacts" as they were referred to hereinabove, support a PWB 23 as shown, for example, in FIG. 2a and maintain the PWB a spaced distance D above the main plane of the conveyor, thereby significantly reducing the number of contact points of the conveyor belt which engage the workpiece. The length of each of the projections is chosen to reduce the "shadow effect" which the strands might otherwise create if the printed wiring board was in direct contact with the strand, i.e. lay in the main plane of the conveyor. In addition to reducing the "shadow effect" the continuous movement of the workpiece through the region of the radiation devices causes the angle of incidence of the focus rays to vary continuously so that the total radiation experienced by any portion of the undersurface of the printed wiring board during the period of time at which such portion of the surface of the printed wiring board is exposed to the rays further aids in the uniform irradiation of the PWB surface irradiated by the irradiation devices 17, 17'.

Nevertheless, the contact points which actually engage the surface of the workpiece has a significant local effect upon the radiation profile and may cause significant differences in physical properties of those points along the workpiece engaged by the contacts as compared with the remaining surface area of the workpiece.

This disadvantageous effect is eliminated by moving the conveyor belt 11 along a curved path which deviates from the imaginary plane P of the conveyor belt in the manner shown in FIG. 3. The conveyor belt 11, as well as the contacts 36–40, are displaced downwardly and away from the workpiece 23 (see FIG. 2a) normally supported by the contacts 36 through 40 forming a "jog" in the normal conveyor path, the jog extending through an angle $\theta$ and having a radius r over a length X representing a portion of the linear conveyor path. The differential shift of the contacts 36–40 relative to the workpiece which they otherwise support is:

$$X - r\theta$$

Since X is the chord of the arc described by $r\theta$, it is always less than $r\theta$ and at this location of the point where the contact touches the board is equal to this differential shift.

An additional advantage is obtained from the present invention when the jog is placed in or close to the zone of irradiation. The vertical displacement of the contact away from the workpiece further reduces and, in fact, minimizes the shadow effect at the support point on the workpiece whereby the effect of the conveyor mesh on irradiation becomes an inconsequential variable.

In summary, by moving the contacts of the conveyor mesh so that they travel a greater distance in the workpiece direction than the general surface of the PWB a relative change in the position of the support points on the PWB is provided thus altering the location of the support points along the engaging surface of the PWB as it undergoes exposure to radiation, as well as a separation of the contacts 36–40 from the surface of the PWB 23 to assure more uniform heating. The fact that the contacts are drawn away from the surface of the PWB while in the irradiation zone further significantly reduces the effect of local shadowing which would otherwise result from the contacts arranged between the engaging surface of the PWB and the source of radiation. In those applications where the "jog" is displaced from the irradiation region separation of the contacts 36–40 from the PWB 23 reduces the heat conducted away from the PWB by the strands 11a.

In addition to the above, the simultaneous irradiation of both sides of the PWB, as is described in greater detail in U.S. Pat. No. 3,744,557 issued July 10, 1973 provides improved energy efficiency and enhanced consistency and repeatable process zones which are obtained by the simultaneous irradiation technique, which teaching is incorporated herein by reference thereto.

Simultaneous irradiation of a workpiece unfortunately yields an undesirable side effect which is manifested as thermal shock and temperature rise in the workpiece. This undesirable effect is minimized in the present invention through the employment of a water envelope surrounding the ultraviolet (UV) source which structure may be similar to that disclosed in U.S. Pat. No. 3,960,081 issued June 1, 1976. As shown in FIG. 3a, the radiation source is comprised of a reflector 18 and a source of UV radiation 19. A cylindrical housing 24 surrounds the UV source 19 and the region between the outer envelope of UV source 19 and the envelope 24 is filled with water as shown as W in FIG. 3a. Approximately 60% of the infrared energy is absorbed by the water W. Since the infrared energy is not used in the UV polymerization of the masking film, this energy is superfluous and only serves to contribute to the undesirable thermal effects described hereinabove. Thus, the heating of the film forming the solder mask is principally the result of the UV radiation and the total amount of heat induced in the workpiece and the film is significantly reduced.

FIGS. 4a and 4b show apparatus employed for providing a "jog" in the conveyor path. FIG. 4a shows a pair of guides G1 and G2 which extend in the region between the conveyor rollers 12 and 13 shown in FIG. 1 and slidably engage and guide the longitudinal sides of the conveyor chain 11. Each of the guides has a cooperating curved portion C1, C2 urging the conveyor into a curved or linear shape as shown in FIGS. 4a and 3. Each of the guides has a channel-shaped cross-section as shown in FIG. 4b through which one side edge of the conveyor chain 11 slidably moves.

FIGS. 4c and 4d show still another embodiment of the jogging arrangement in which a pair of guides G1', G2' each having an L-shaped cross-section are each provided with a cooperating curved portion C1', C2'. Each curved portion cooperates with a large sprocket S1, S2, sprocket S2 shown partially broken away for purposes of clarity. The sprockets S1 and S2 are preferably driven by shafts Sh1, Sh2 extending away from the irradiation region. The teeth T of the sprockets S1 and S2 move into the open spaces between adjacent "strands" of the conveyor. The guides G1' and G2' have a substantially L-shaped cross-section as shown in FIG. 4d and cooperate with the sprockets S1 and S2 to provide the "jog" within the upper conveyor run.

FIG. 4e shows still another alternative embodiment in which the guides G1' and G2' of FIG. 4c may be eliminated and replaced by smaller diameter sprockets S3 and S4 whose teeth T enter into the spaces between adjacent strands of the conveyor 11 and cooperate with their associated large diameter sprockets, such as, for example, sprocket S1 to provide the desirable jog. It should be understood that a pair of assemblies of the type shown in FIG. 4e are arranged along opposite respective longitudinal sides of the upper run of conveyor 11. It should be understood that any other type of guide means may be employed without departing from the spirit and scope of the present invention, it being understood that the significant aspect of the guide means is to provide a "jog" in the conveyor run and, more particularly, wherein the jog is arranged in the region in which the printed wiring boards undergo radiation, and in the particular embodiment described herein undergo UV radiation. If desired, more than one "jog" may be provided along the upper run of conveyor belt 11 using any of the embodiments of FIGS. 4a–4f.

The number of jogs imparted to the conveyor belt may be greater than one. If desired, for example, jogs may be imparted to the conveyor belt directly before entering and directly after leaving the irradiation station. Alternatively, jogs may be imparted to the conveyor belt at a location overlapping with or coinciding with the irradiation station as well as providing a jog or jogs to the conveyor belt immediately before entering the irradiation station and/or immediately after leaving the irradiation station, the number and location of the jogs being controlled by the nature of the treatment being performed.

The apparatus of the present invention is particularly useful in a dry film solder masking method which employs a liquid component applied to the PWB surface and arranged between the PWB surface and the dry film forming the solder mask, which liquid component is utilized to fill voids and irregularities on the surface of the PWB. The liquid component is a 100% reactive material such as, for example, the VALU solder mask system by duPont which eventually polymerizes when subjected to UV radiation and becomes solid and one with the overlying masking film as a result of the UV radiation.

When using prior art apparatus to carry out the aforementioned dry film solder masking process, it was found that the liquid component applied to the PWB is unstable and caused the overlaying film to bulge and, in extreme instances to crack and fail due to thermal shock and excursion.

These problems were eliminated through the employment of the apparatus shown in FIG. 5 wherein the PWBs undergo two stages or phases of curing through the respective apparatuses 10 and 10'. The apparatuses designated 10 and 10' may be substantially identical to one another except that the apparatus 10 is provided with infrared absorbing water jackets 24, 24 whereas the water jackets are omitted in the apparatus 10'. The technique employed therein comprises placing the PWBs, such as, for example, PWB 23 upon conveyor 11 so that it is supported by the contacts 36-40 thereon and maintained a displaced distance D (see FIG. 2a) above the main plane of the conveyor 11. One or both sides of PWB 23 are treated so that the solder mask overlays the aforementioned liquid component.

The PWB 23 undergoes a first radiation phase in which the PWB is exposed to UV radiation wherein most of the infrared radiation generated by radiation source 19 is absorbed by the water W in each of the jackets 24. The liquid component in the holes and/or irregularities of the PWB 23 becomes semi-cured or semi-solid and has sufficient physical stability to prepare the liquid component for further UV processing which is accomplished by the apparatus 10' in which the water jackets 24 are eliminated to provide additional infrared heating to the UV radiation to heat and thereby fully cure the liquid component as well as the solder mask material which liquid component polymerizes and becomes solid and one with the overlying film and which does not cause the overlaying film to either bulge or crack. The energy level of the UV source, the speed of the conveyor belt and the spacing between the apparatuses 10 and 10' employed for performing the semi-curing and final curing phases are chosen so as to cause the solder mask material to polymerize and cure without damage caused by thermal excursion or physical separation.

Since the amount of energy required may vary according to the type of solder mask material, the type and nature of the printed wiring board, and other factors, it is important to provide means for adjusting the energy output of the UV lamps. It is also important to be able to adjust the outputs of the various lamps to balance the radiation levels in order to achieve desired energy profiles. For example, it is desirable to operate the UV lamps 17 and 17' arranged beneath conveyor 11 (see FIG. 1) at higher energy levels than the UV sources 16, 16' due to the presence of conveyor belt 11. The conventional technique utilized in the prior art is comprised of switching capacitors into and out of the lamp power circuit. This technique fails to provide for smooth, continuous adjustment over the power output range.

Figure 6:
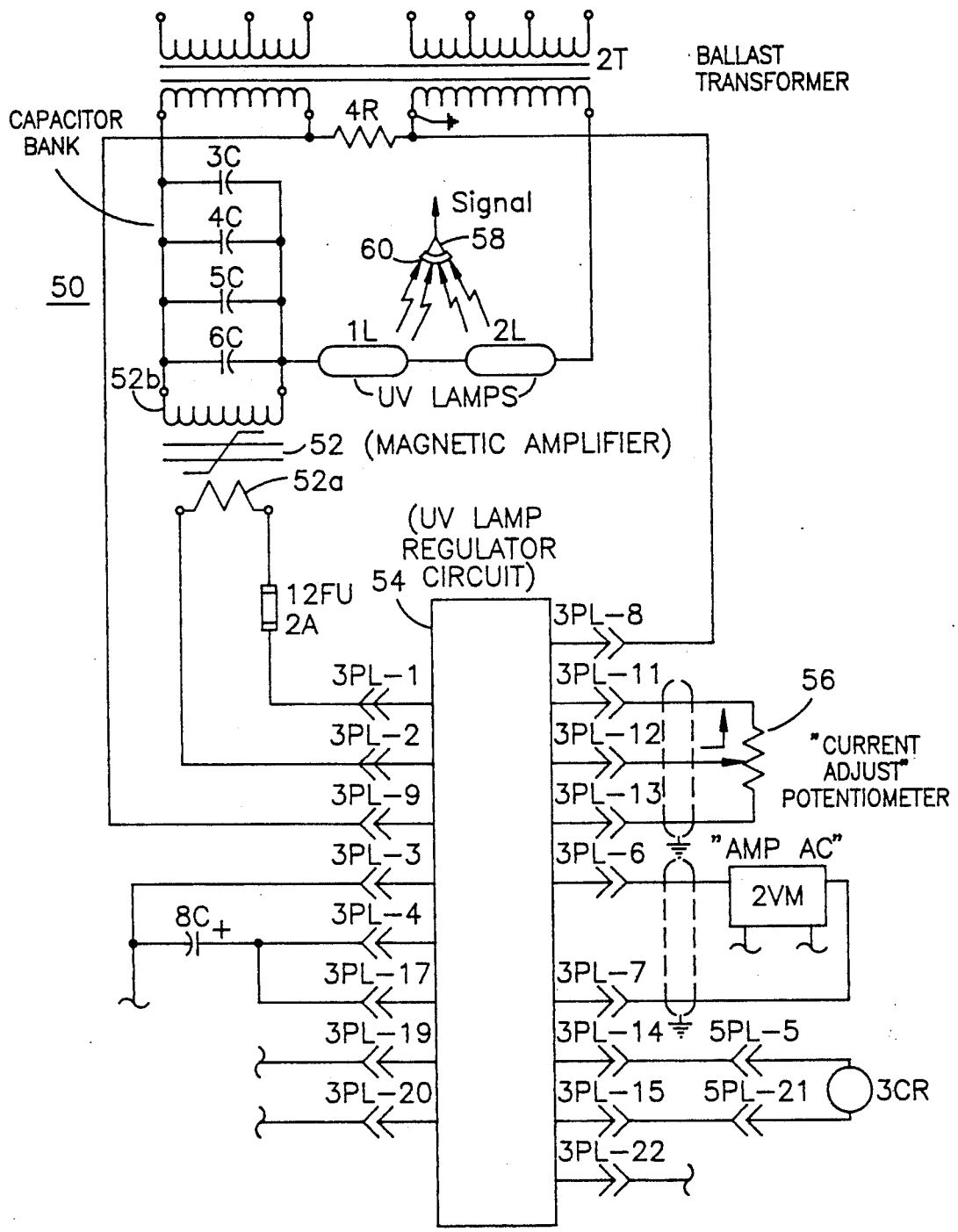
FIG. 6 is a simplified schematic diagram showing the control circuitry employed for adjusting the output of the radiation devices employed in the embodiment of FIG. 3, for example and further showing the technique employed for controlling the radiant energy device to maintain a constant output energy level of the useful energy.

FIG. 6 shows an electronic circuit 50 which provides for the smooth, continuous adjustment of output power while avoiding the need for capacitive switching employed in prior art techniques. The circuit 50 of FIG. 6 is comprised of a magnetic amplifier 52 connected in electrical parallel with a bank of capacitors 3C-6C. The parallel connected capacitors and winding 52b of magnetic amplifier 52 are in electrical series with lamps 1L, 2L. This electrical series, parallel combination is coupled across the secondary of a ballast transformer 2T whose primary is connected to a source of suitable AC energy (not shown for purposes of simplicity).

Figure 6A:
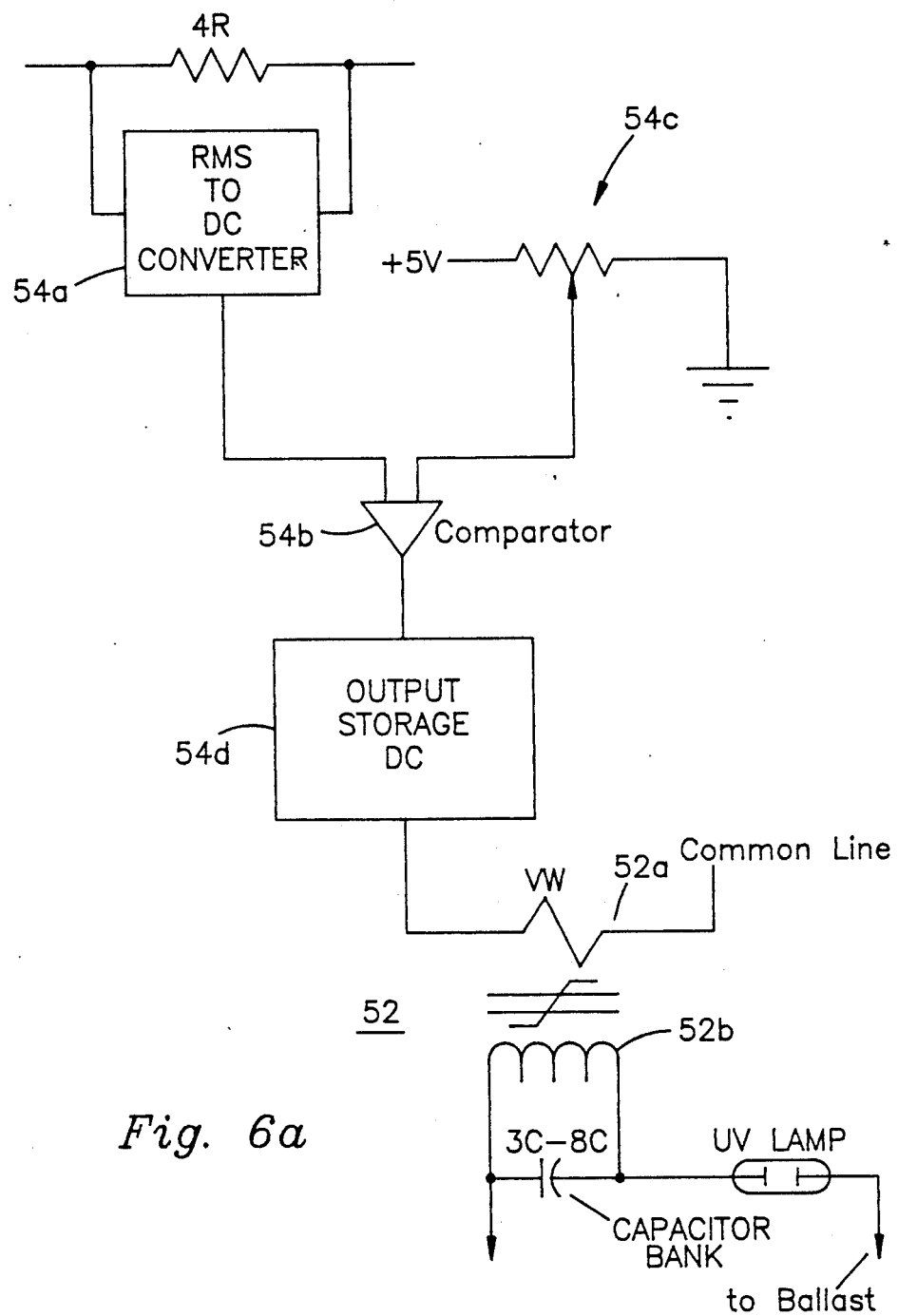
FIG. 6a shows a block diagram of the control circuitry employed in the lamp regulator circuit of FIG. 6.

The adjacent terminals of the ballast transformer secondary windings are coupled to the end terminals of a sensing resistor 4R which terminals are also connected to terminals 3PL8 and 3PL9 of lamp regulator circuit 54. Circuit 54, which is shown in greater detail in FIG. 6a, is comprised of an RMS/DC converter 54a which is coupled across the resistor 4R in the secondary circuit of the ballast. This DC level is compared against a threshold value established by potentiometer 54c, by means of comparator 54b whose output is coupled to an output stage 54d which is a current generator generating a current responsive to the differential between the voltages of converter 54a and potentiometer 54c.

The current applied to the magnetic amplifier controls the inductance value of secondary winding 52b coupled across a parallel circuit of capacitors 3C-8C, shown in simplified fashion in FIG. 6a as a single capacitance. The parallel circuit of 52b and 3C-8C is coupled in series with the lamp as shown. Circuit 54 thus monitors the current in the secondary winding of the ballast transformer 2T, which signal is utilized as a feedback signal which in turn generates a regulated DC current applied to the primary winding 52a of magnetic amplifier 52. The regulated DC current provides an inductive vector which effectively counteracts the capacitive vector of the capacitor bank and increases or decreases the conductance of the parallel LC network thereby controlling the current to lamps 1L and 2L. This circuit has the advantage of utilizing a small DC current which has a very large effect on the circuit conductance. The stability and regulation of the circuit is achieved by the current sensed in the secondary winding of ballast transformer 2T to resistor 4R. The current and regulator circuit is adjusted by the potentiometer 56.

Although the circuit 50 shown in FIG. 6 simultaneously regulates the energy delivered to both lamps 1L and 2L, separate independent circuits may be employed for each of the UV lamps. Alternatively, the circuit shown in FIG. 6 may be employed for the two upper UV lamps provided in sources 16 and 16' shown in FIG. 1 and an independent circuit substantially identical to that shown in FIG. 6 may be employed for simultaneously adjusting the lamps 19 for the lower energy sources 17, 17'.

Since the useful output energy of the lamps may vary over time, it is extremely desirable to more effectively adjust the energy levels to compensate for such changes. For example, the lower lamps, as well as their reflectors are more likely to collect dust and foreign particles on their exposed surfaces which will reduce the useful energy output level of the apparatus even though the power to the lamps and the output energy of the lamp is unchanged. In order to maintain the useful output energy levels constant over time and to avoid the necessity of constant cleaning of the reflectors and light sources, the lamp outputs may be determined as a function of the actual useful UV energy impinging on the surface rather than measuring the secondary current of the ballast transformer for this purpose. This is accomplished by providing a UV sensor 58 fitted with an appropriate band-pass filter 60 to pass only UV radiation to sensor 58. This signal is then coupled to the lamp regulator circuit 54 in place of the current signal delivered by sensing resistor 4R thereby controlling the lamp power as a function of the useful UV radiation outputted by the lamp rather than as a function of lamp current which clearly would not take into account factors such as aging of the lamp and the accumulation of dust, dirt or other foreign matter upon the reflector surface and lamp surface thereby providing a more accurate measurement of useful energy output.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. Apparatus for irradiating workpieces and the like comprising
    open mesh conveyor means for supporting the workpiece;
    means for moving said conveyor means in a predetermined direction to pass the workpiece supported thereon through an irradiating station;
    irradiating source means positioned at said irradiating station for irradiating one surface of said workpiece, said irradiating source means being positioned to direct radiation from said source through said open mesh conveyor means before reaching the surface of the workpiece to be irradiated;
    said conveyor means being provided with a plurality of projections at predetermined locations therealong so as to support said workpiece and displace said workpiece from the main plane of the conveyor means by a predetermined distance, said displacement distance being selected to reduce the shadow effect of the open mesh conveyor means upon the irradiated surface of the workpiece;
    jog means for moving said conveyor means through a curvilinear path whereby the projections supporting said workpiece are displaced from the workpiece as it moves along said curvilinear path and thereafter returned to engage said workpiece to thereby assure more uniform irradiation and treatment of the surface area of the workpiece exposed to said radiation.

2. The apparatus of claim 1 wherein said conveyor means comprises:
    an elongated flexible conveyor belt having longitudinal sides which are substantially parallel;
    said jog means comprising guide means engaging the opposite longitudinal sides of said belt for urging a portion of the belt passing through said guide means to assume a curvilinear path to move the portion of the belt passing along said guide means away from the main plane of the belt and thereafter return to the main plane of the belt.

3. The apparatus of claim 2 wherein said guide means comprises:
    a pair of elongated guide channels each slidably receiving one of the longitudinal sides of said belt and having cooperating curvilinear portions.

4. The apparatus of claim 2 wherein said guide means comprises:
    a pair of guide members for slidably engaging opposite longitudinal sides of said belt;
    said guide members each having a cooperating curvilinear shaped portion;
    sprocket means having a radius of curvature conforming to the radius of curvature of the curvilinear-shaped portion of said guide plate;
    said sprocket means having sprocket teeth for engaging opposite longitudinal sides of said belt.

5. The apparatus of claim 2 wherein said guide means comprises:
    first and second large diameter sprocket means each having teeth for engaging the opposite longitudinal sides of said belt;
    first and second small diameter sprocket means arranged respectively upstream and downstream relative to each large diameter sprocket means and having teeth for engaging the conveyor belt;
    each large diameter sprocket means and its associated first and second small diameter sprocket means urging the portion of the conveyor belt engaged thereby to follow a curvilinear path substantially defined by the radius of curvature of said large diameter sprocket means.

6. The apparatus of claim 2 wherein said guide means comprises:
    first and second pairs of sprockets arranged at spaced intervals along opposite longitudinal sides of said belt, all of said sprockets having teeth for engaging said belt;
    first and second curvilinear guide means arranged adjacent each of said pairs of sprockets and cooperating with said sprockets to urge the portion of the belt passing therealong into a curvilinear shape having a radius of curvature defined by the curvilinear shape of said guide means.

7. The apparatus of claim 1 wherein said conveyor means comprises a conveyor belt formed of a plurality of interlocking strands which form an open-weave mesh structure whereby the openings formed in the plane of said conveyor belt occupy a greater portion of the surface area of the plane of said conveyor than the surface area occupied by said strands.

8. The apparatus of claim 7 wherein selected ones of said strands are provided with said projections for supporting a workpiece placed upon said belt, a spaced distance above the plane of said conveyor belt to minimize the surface contact between said conveyor belt and the surface of the workpiece engaged by said projections.

9. The apparatus of claim 7 wherein said strands are each comprised of elongated wire-shaped members bent in an undulating fashion, each of said strands being interlocked with adjacent strands to form a flexible conveyor belt.

10. The apparatus of claim 7 wherein said projections are formed by bending said strands at predetermined locations therealong into inverted, substantially V-shaped configurations which project away from the plane of the conveyor belt for supporting the workpiece to be treated a spaced distance from the plane of the conveyor belt.

11. The apparatus of claim 1 wherein said jog means is located to impart a jog to said conveyor belt in the region of said irradiation station.

12. The apparatus of claim 1 wherein said curvilinear path imparted to the conveyor belt is arranged so that the concave portion thereof faces said workpiece.

13. The apparatus of claim 1 wherein said workpiece has opposing first and second major surfaces, said first major surface being irradiated by said first mentioned irradiation source means.

14. The apparatus of claim 13 further comprising a second irradiation source means for irradiating the second major surface of said workpiece.

15. The apparatus of claim 14 wherein said workpiece is a printed wiring board.

16. The apparatus of claim 1 wherein said irradiation source means comprises means for generating ultraviolet radiation and reflector means for focussing the ultraviolet radiation from said ultraviolet radiation means and directing the focussed radiation toward said workpiece.

17. The apparatus of claim 14 wherein said first and second irradiation sources means each comprise means for generating ultraviolet radiation and reflector means for focussing the ultraviolet radiation from its associated source and directing the focussed radiation toward one surface of said workpiece.

18. The apparatus of claim 16 further comprising a jacket surrounding said irradiation source means, said jacket being filled with material for absorbing infrared energy.

19. The apparatus of claim 18 wherein said material is water.

20. The apparatus of claim 1 wherein said irradiation source means comprises first and second ultraviolet radiation generating sources for sequentially irradiating the one surface of said workpiece.

21. The apparatus of claim 1 wherein said irradiation source means further comprises:
means for energizing said irradiation source means;
means for sensing the radiation emitted by said irradiation source means;
means responsive to the signal developed by said sensor means for adjusting the level of energy applied to said irradiation source means by said power source.

22. The apparatus of claim 24 wherein said irradiation source means comprises:
a lamp;
capacitance means;
adjustable inductance means coupled in parallel with said capacitance means;
said parallel connected capacitance and inductance means being coupled in electrical series with said lamp and an AC power source;
means responsive to the signal generated by said sensor means for adjusting said inductance.

23. The apparatus of claim 22 wherein said inductance comprises magnetic amplifier means having input and output windings;
means for regulating a DC current applied to said magnetic amplifier means input winding wherein the magnitude of said DC current controls the inductance of the magnetic amplifier means secondary winding to thereby adjust the conductance in said lamp circuit.

24. The apparatus of claim 23 wherein said lamp circuit further comprises an AC energy source;
ballast transformer means for coupling said AC energy source to said lamp and said parallel connected inductance and capacitance means, said coupling transformer means comprising a primary winding coupled to said AC energy source and a secondary winding coupled in electrical series with said parallel connected inductance and capacitance means and said lamp;
means for sensing the magnitude of current in said ballast transformer secondary winding;
means responsive to the current in said ballast transformer secondary winding for regulating a DC current applied to said magnetic amplifier means for adjusting the conductance of the parallel connected capacitance and inductance means.

25. The apparatus of claim 24 wherein said current detection circuit includes resistance means coupled in series with said ballast transformer means secondary winding and means coupled to said resistance means for sensing the magnitude of current in said ballast transformer means secondary winding.

26. The apparatus of claim 24 further comprising potentiometer means for manually adjusting the DC current applied to said magnetic amplifier means.

27. Apparatus for irradiating workpieces and the like comprising:
open mesh conveyor means for supporting the workpiece;
means for moving said conveyor means in a predetermined direction to pass the workpiece supported thereon through an irradiating station;
irradiating source means positioned at said irradiating station for irradiating one surface of said workpiece;
said conveyor means being provided with a plurality of projections at predetermined locations therealong so as to support said workpiece and displace said workpiece from the main plane of the conveyor means by a predetermined distance, said displacement distance being selected to reduce the shadow effect of the open mesh conveyor means upon the irradiated surface of the workpiece;
jog means for moving said conveyor means through a curvilinear path whereby the projections supporting said workpiece are displaced from the workpiece as it moves along said curvilinear path and returned to engage said workpiece to thereby assure more uniform irradiation and treatment of the surface area of the workpiece exposed to said radiation.

* * * * *

UNITED STATES PATENT AND TRADEMARK OFFICE
CERTIFICATE OF CORRECTION

PATENT NO. : 5,040,236
DATED : August 13, 1991
INVENTOR(S) : Bernard J. Costello It is certified that error appears in the above-identified patent and that said Letters Patent is hereby corrected as shown below:

Title Page:
In the Abstract, line 21, change "tecnique" to --technique--

Column 13, line 32, change "sources" to --source--

Column 13, line 56, change "claim 24" to --claim 21--

Signed and Sealed this

Second Day of March, 1993

*Attest:*

STEPHEN G. KUNIN

*Attesting Officer*     Acting Commissioner of Patents and Trademarks